United States Patent
Pozzuoli

(10) Patent No.: US 7,239,497 B2
(45) Date of Patent: Jul. 3, 2007

(54) ENVIRONMENTALLY HARDENED ETHERNET SWITCH

(75) Inventor: Marzio Paride Pozzuoli, Maple (CA)

(73) Assignee: Ruggedcom Inc., Woodbrige, Ontario (CA)

( * ) Notice: Subject to any disclaimer, the term of this patent is extended or adjusted under 35 U.S.C. 154(b) by 80 days.

(21) Appl. No.: 10/962,745

(22) Filed: Oct. 13, 2004

(65) Prior Publication Data

US 2005/0122689 A1    Jun. 9, 2005

Related U.S. Application Data

(63) Continuation of application No. 10/330,148, filed on Dec. 30, 2002, now abandoned.

(30) Foreign Application Priority Data

Jan. 2, 2002    (CA) ..................................... 2366941

(51) Int. Cl.
H02H 3/22    (2006.01)

(52) U.S. Cl. ..................................... 361/111

(58) Field of Classification Search ................ 361/111, 361/56

See application file for complete search history.

(56) References Cited

U.S. PATENT DOCUMENTS

| | | | | |
|---|---|---|---|---|
| 4,571,656 | A | * | 2/1986 | Ruckman ...................... 361/56 |
| 4,802,055 | A | * | 1/1989 | Beckerman ................... 361/56 |
| 4,884,242 | A | * | 11/1989 | Lacy et al. .................. 365/229 |
| 5,027,002 | A | * | 6/1991 | Thornton ...................... 307/35 |
| 5,557,176 | A | * | 9/1996 | O'Brien ...................... 315/307 |
| 5,747,889 | A | * | 5/1998 | Raynham et al. ............. 307/80 |
| 5,818,705 | A | * | 10/1998 | Faulk ........................... 363/48 |
| 5,905,623 | A | * | 5/1999 | McCartney ................. 361/119 |
| 6,556,097 | B2 | * | 4/2003 | Coffey ...................... 333/24 R |

* cited by examiner

Primary Examiner—Brian Sircus
Assistant Examiner—Boris Benenson

(57) ABSTRACT

A device for hardening an Ethernet switch is disclosed. The device provides cooling for the switch, and, suppresses electrical transients and electromagnetic interference, which could affect the power supply, and data transmission of the Ethernet switch. Using this device, the Ethernet switch can be used in harsh industrial environments, such as those present in power utility substations.

7 Claims, 4 Drawing Sheets

ENVIRONMENTALLY HARDENED ETHERNET SWITCH

This application is a continuation application of application Ser. No. 10/330,148 filed Dec. 30, 2002, now abandoned.

FIELD OF THE INVENTION

The present invention relates in general to the field of computer communication networks and specifically to Ethernet switching hubs (Ethernet Switch) suitable for use in harsh industrial environments such as those found in electric power utility substations.

BACKGROUND OF THE INVENTION

Trends in the electric power utility automation sector, specifically substation automation, have been driving towards common communications architecture. The initiative was begun in the early 1990s driven by the major North American utilities under the technical auspices of Electric Power Research Institute (EPRI). The resulting standard that emerged is known as the Utility Communications Architecture 2.0 (UCA2). At the heart of this architecture is the substation LAN (Local Area Network) based on Ethernet. However, one of the major requirements for electronic devices used in substations as part of a protection and control system is their ability to operate reliably in harsh environmental conditions. Harsh environmental conditions include conditions having both adverse atmospheric conditions and adverse electrical conditions. Substation environments are much harsher than the office environments where the overwhelmingly majority of Ethernet equipment resides and was designed for.

It would therefore be desirable for the Ethernet switch, which forms the backbone of the substation LAN, to be as reliable and robust as other IEDs (Intelligent Electronic Devices) designed specifically to operate in harsh substation environments. One such group of IEDs are protective relays which perform the function of protecting the power system from ault conditions and other anomalies. Modern, microprocessor based protective relays are adhering to the UCA2 standard and providing one or multiple Ethernet ports ready to connect to suitable Ethernet Switches.

However, the prior art Ethernet switches do not meet these standards. In particular, the prior art switches do not adhere to the ANSI/IEEE C37.90 standard (US)and the IEC-60255 standard (Europe) which were designed for protective relaying IEDs and other intelligent devices found in electrical substations. For example, the prior art devices do not satisfy at least the following criteria.

(A) Electrical Environment
1. Surge Withstand Capability as per ANSI/IEEE C37.90.1 (1989), namely withstanding 2.5 k V oscillatory) transients, 4.0 kV fast transients applied directly across ach output, input and power supply circuit.
2. Surge Immunity as per IEC 610004-5 (1995 Level 4) standards.
3. High Frequency Noise Disturbance as per IEC 60255-22-1 (1988 Class III) standards.
4. Fast Transient Disturbance as per IEC 60255-22-4 (1992 Class IV) standards, namely withstanding 4 kV, 2.5 kHz applied directly to the power supply inputs and 4 kV, 2.5 kHz applied directly to all other inputs.
5. Dielectric Withstand as per ANSI/IEEE C37.90-1989 and IEC 60255-5: 1977 standards.
6. High Voltage Impulse Test as per IEC 60255-5: 1977 standard.
7. Electrostatic Discharge as per IEC 60255-22-2: 1996 Class 4 and Class 3 standards.
8. Radiated Radio Frequency Immunity as per IEEE C37.90.2 and IEC 61000-4-3 standards.

(B) Atmospheric Environment
1. Temperature: Cold at −40° C. as per the IEC 60068-2-1 standard and dry heat at 85° C. as per IEC 60068-2-2 standard.
2. Temperature Cyclic: −25° C. to +55° C. as per IEC 60255-6 (1998) standard.
3. Relative Humidity: 5 to 95% as per the IEC 60068-2-2 standard.

Referring now to FIG. 1, an electronic circuit block diagram, shown generally by reference numeral 10 of a conventional commercial Ethernet Switch is shown. The circuit 10 consists of an Ethernet Media Access Controller (MAC) block 1 which typically provides a plurality of communications ports each adhering to the Reduced Media Independent Interfaces (RMII) signaling specification as put forth by the version 1.2 of the RMII Consortium. These RMII ports interface to a physical layer device 4, referred to as a PHY, which converts the RMII signals to differential transmit and receive signal pairs in accordance with the IEEE 802.3 10BaseT and or 100BaseTX standards. These signals are then noise filtered by the filter block 5a and electrically isolated via pulse transformers 5b which also couple the signals to the RJ45 style connector receptacles 5c which are typical of commercial grade Ethernet Switches. The RJ45 interface 8 typically accepts TIA/EIA 568 category 5 (CAT-5) unshielded twisted pair copper wire cables. Power is typically provided by a single power supply block 6 and cooling of the electronics is also typically provided by a low-voltage DC powered cooling fan 7 typical of those found in personal computers.

The electronic circuit 10 illustrated in FIG. 1 has numerous shortcomings when used in a utility substation environment. In particular the switch is susceptible to electrical transients and electromagnetic interference being coupled into the device via twisted pair copper cables 8. This is extremely undesirable since it could result in corruption of real-time mission critical control messages being transmitted over the network via the switch. Moreover, actual damage to the switch itself is possible if high voltage electrical transients are directly coupled into the device via the copper cables overcoming the limited electrical isolation (typically) 1500 RMS) provided by isolation transformers 5b. Another point of electrical transient susceptibility in the design of FIG. 1 is the power supply input 6a. The power supply block 6 must be capable of enduring electrical transients at levels of 2 kV to 5 kV as specified by the ANSI/IEEE C37.90 and IEC 60255 standards. This is not a requirement for commercial grade Ethernet Switches and thus the power supply inputs 6a do not provide suitable transient suppression circuitry. Furthermore, commercial grade Ethernet switches are not specifically designed to withstand EMI (Electromagnetic Interference) levels of 35 V/m as specified by ANSI/IEEE C37.90.2 (1995) which is typical of the substation environment.

Accordingly, conventional circuit 10 suffers from the disadvantage that it is susceptible to electrical transients and electromagnetic interference at levels which are possible, or even common, in utility substation environment. The design of FIG. 1 is also susceptible to mechanical breakdown because of the use of rotating cooling fan 7 required to cool the electronic components. Thus the reliability of the Ethernet Switch is determined by the reliability of the fan which is the only moving mechanical part in the design and typically has the lowest Mean-Time-Between-Failures (MTBF) value, such as less than 10,000 Hrs, compared to electronic components which have MTBF values of greater than 450,000 Hrs. It would be highly desirable to eliminate the fan block 7 from the design and improve the reliability of the Ethernet Switch to MTBF levels similar to those of the IEDs, which would be connected to it, namely greater than 450,000 Hrs. Furthermore, the typical operating temperature range of commercial Ethernet Switches having the circuit 10 shown in FIG. 1, is 0° C. to 40° C. (ambient) with fan cooling 7. However, the operating temperature range for devices in the substation environment such as protective relays is specified by the IEC 60255-6 (1998) standard as −25° C. to +55° C. Therefore, not only is the circuit 10 of FIG. 1 susceptible to failure, it also does not meet the requirements of the environmental conditions which are possible, or even common in utility substation environments.

Furthermore, because of the mission critical nature of the application, that being the use of the substation LAN to send real-time control messages during power system fault conditions, the availability or "up time" of the Ethernet Switch is critical to proper operation of the protection and control system. A further point of susceptibility of the design of FIG. 1 is the power supply block 6. If the power supply block 6 fails then the Ethernet Switch fails and is not available to provide the backbone of the LAN during the critical period of time where the protection and control system needs to respond in the order 4 to 100 ms. Accordingly, there is a need in the art for an Ethernet Switch having redundant, parallel power supply blocks such that if one failed the other would continue to supply the required regulated power to the Ethernet Switch without any interruption to its operation.

SUMMARY OF THE INVENTION

It is the object of the present invention to provide an improved Ethernet switching hub (Ethernet Switch) which at least partially overcomes the above-mentioned disadvantages of existing devices. In addition, it is an object of this invention to provide an Ethernet Switch that is capable of operating reliably in harsh industrial environments such as those found in electric power utility substations.

In one aspect, the present invention resides in an Ethernet switch for use in an electrical power utility substation, a device for cooling the switch comprising: a thermoelectric cooling element having a first surface for thermally contacting a component in the Ethernet switch, and, a second surface for thermally contacting a heat sink, said thermoelectric cooling element transferring heat from the first surface to the second surface in response to a current applied to the thermoelectric cooling element; a control block for applying the current to the thermoelectric cooling element when the temperature of the Ethernet switch exceeds a predetermined range.

In a further aspect, this invention resides in an Ethernet switch for use in an electrical power utility substation, a transient suppression device for suppressing electrical interference to a power supply of the Ethernet switch, said device comprising: an input connectable to the external power connector; an output connectable to a power input for the Ethernet switch; at least one varistor connected in parallel with the input and output; at least one tranzorb connected in parallel across the input and output; at least one capacitor connected in parallel with the input and output.

One advantage of the present invention is that the circuit for use in the Ethernet Switch has a high degree of resistance to electrical transient effects and electromagnetic interferences. In particular, the circuit provides transient suppression of electrical signals entering into the power supply. This is accomplished in a preferred embodiment by using a combination of transzorbs, metal oxides varistors, and one or more capacitors. Furthermore, the device provides a conversion block for converting electrical signals into fiber optic signals and a fiber optical transmitter/receiver.

A further advantage of the present invention is that the circuit provides for thermoelectric cooling. Thermoelectric cooling increases the reliability of the system and has a much higher MTBF. Furthermore, the thermoelectric cooling has a larger cooling range such that, by providing one or more thermoelectric cooling blocks, the operating temperature range of the entire circuit can be controlled. Furthermore, in a preferred embodiment, the thermoelectric cooling can have a heat sink with an extension which extends outside of the switch and/or the utility station enclosure, thereby facilitating removal of thermal energy from the enclosure, and cooling of the entire circuit.

Further aspects of the invention will become apparent upon reading the following detailed description and drawings which illustrate the invention and preferred embodiments of the invention.

BRIEF DESCRIPTION OF THE DRAWINGS

In the drawings, which illustrate embodiments of the invention.

DETAILED DESCRIPTION OF THE INVENTION

A preferred embodiment of the present invention and its advantages can be understood by referring to the present drawings. In the present drawings, like numerals are used for like corresponding parts of the accompanying drawings.

Figure 2:
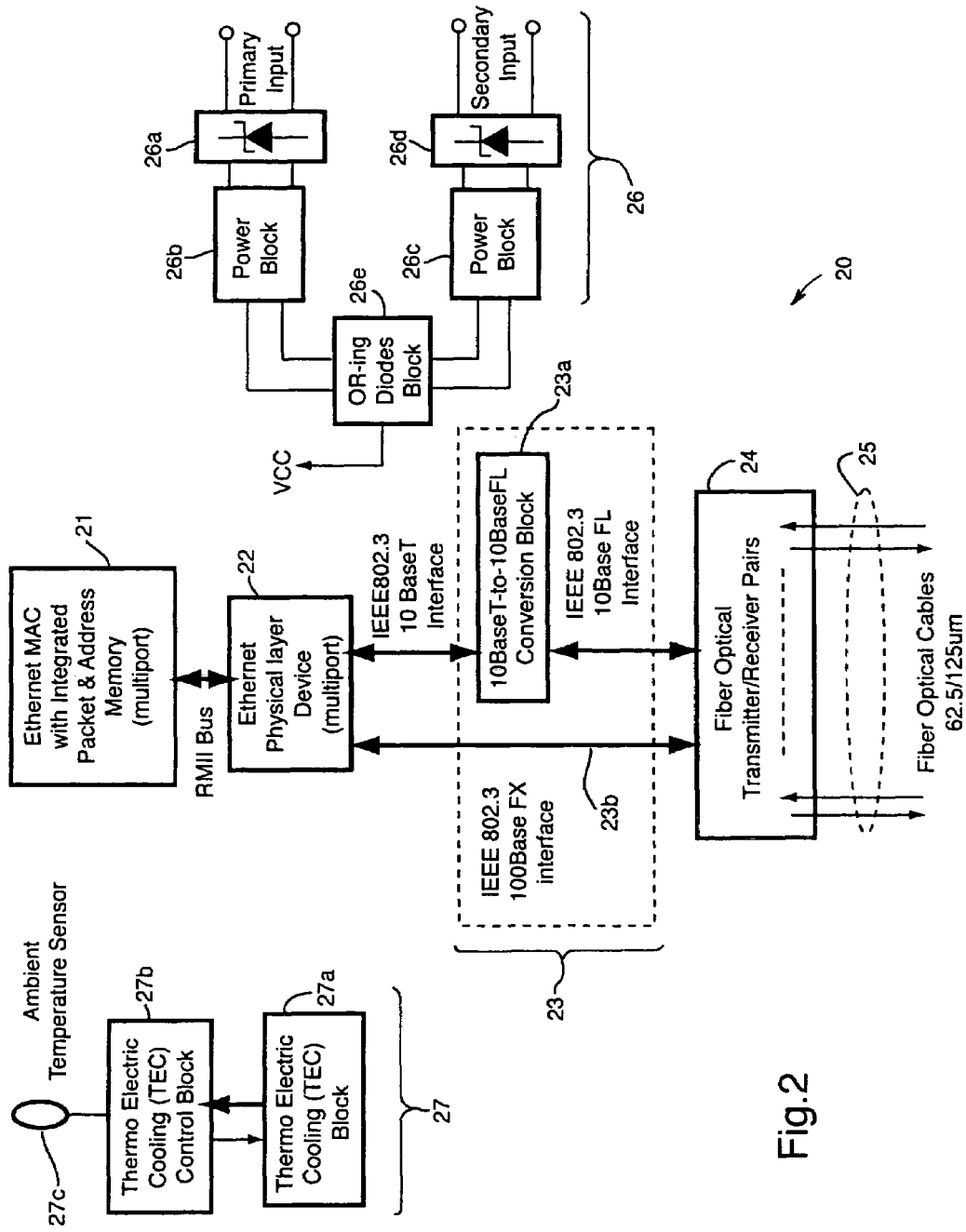
FIG. 2 shows a block diagram showing an electrical circuit for use in an Ethernet Switch according to one embodiment of the present invention.

FIG. 2 illustrates an electronic circuit block diagram shown generally by reference numeral 20, for an Ethernet switch according to one embodiment of the present invention. The circuit consists of an Ethernet Media Access Controller (MAC) block 21 with integrated packet and address memory which provides a plurality of communications ports each adhering to the RMII (Reduced Media Independent Interfaces) signaling specification as put forth by the version 1.2 of the RMII Consortium. Such a block 21 may be implemented using Marvell 88E6050 or a Galileo GT48350.

These RMII ports interface to a multi-port physical layer device 22, referred to as a PHY, which converts the RMII signals to differential transmit and receive signal pairs in accordance with the IEEE 802.3 10BaseT and or 100BaseTX standards. The PHY portion of the circuit can be implemented by an AMD (Advanced Micro Devices) Am79C875 quad PHY device which is capable of industrial grade (i.e. −40 to 85° C.) operating temperature.

For 10 Mbps operation the differential 10BaseT signal pairs interface to a 10BaseT-to-10BaseFL conversion block 23 which will convert the 10BaseT differential signal pairs to current drive signals capable of driving fiber optical LED transmitters 24 and interfacing to LED fiber optical receivers 24 with outputs as low as 2 mVp-p and a dynamic range of 55 dB. A Micro Linear ML4669 or ML6651 may implement the 10BaseT-to-10BaseFL conversion block. Versions of these components are available which will operate at industrial grade temperatures.

The output signals of the 10BaseT-to-10BaseFL conversion block interface directly to the fiber optical transmitter and receiver pairs 24. These may be implemented by Agilent Technologies (Trade Mark) HFBR-2416 and HFBR-1414 receiver and transmitter component pair. These components are capable of industrial grade operating temperatures.

For 100 Mbps operation the PHY devices 22 chosen for the present embodiment of the invention are capable of directly interfacing 23b to 100 Mbps fiber optical transceivers 24 with Pseudo Emitter Coupled Logic (PECL) interfaces that are compliant with the 100BaseFX version of the IEEE 802.3u standard. The 100 Mbps fiber optical transceivers may be implemented using Agilent Technologies HFBR-5903 (Trade Mark) or other similar fiber optical transceiver.

Figure 1:
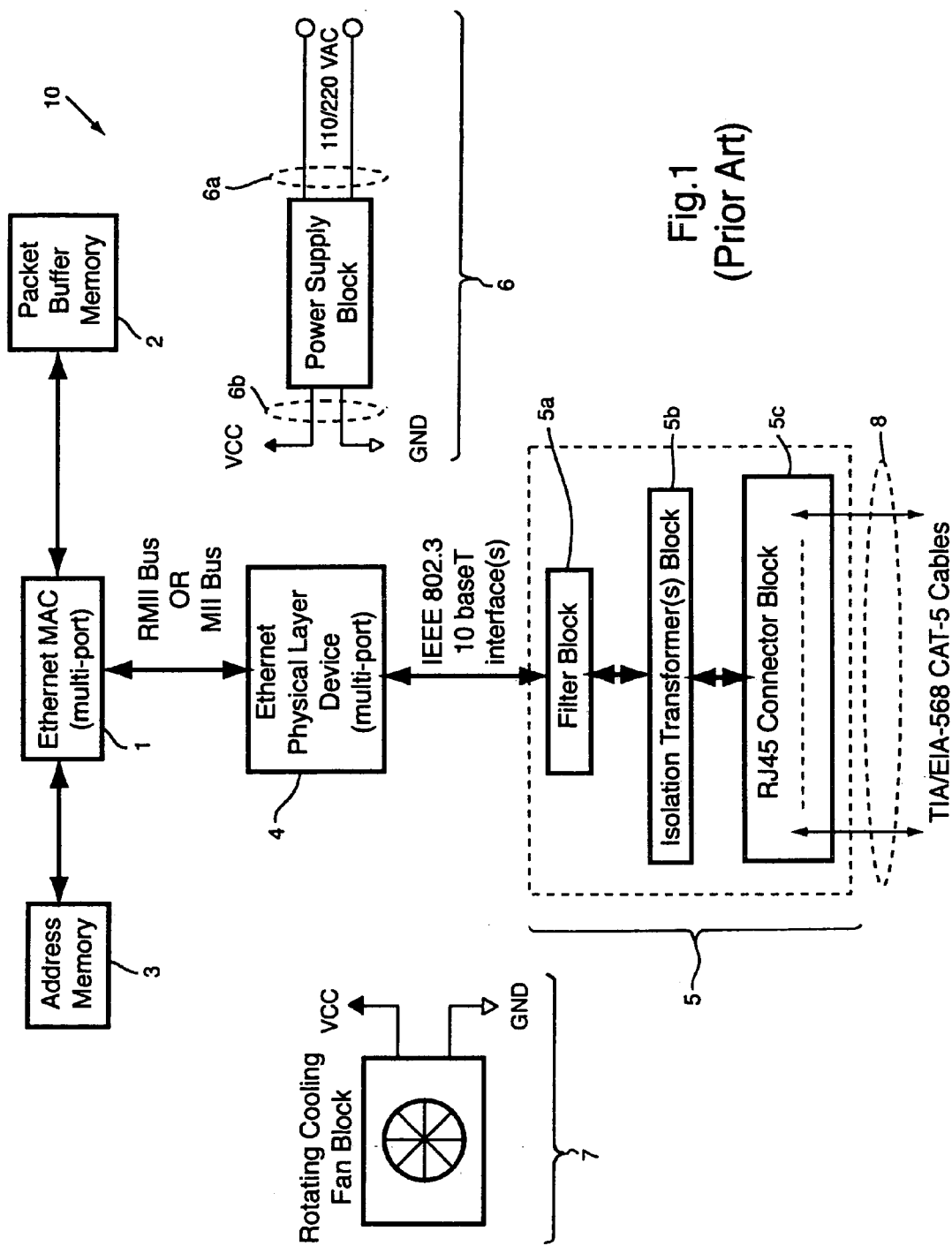
FIG. 1 shows a block diagram showing an electric circuit used in a conventional Ethernet Switch.

It should be appreciated that by using a fiber optical communications medium that the system is no longer susceptible to electrical transients and electromagnetic interference being coupled into the device as is the case with the twisted pair copper cables 8 of FIG. 1.

Regulated DC voltages, suitable for operating the electronics, are supplied to the system via dual redundant power supplies 26. Transient suppression 26a for power supply block #1 26b is provided at the inputs. The same transient suppression 26d is provided for power supply block #2 26c.

Figure 3:
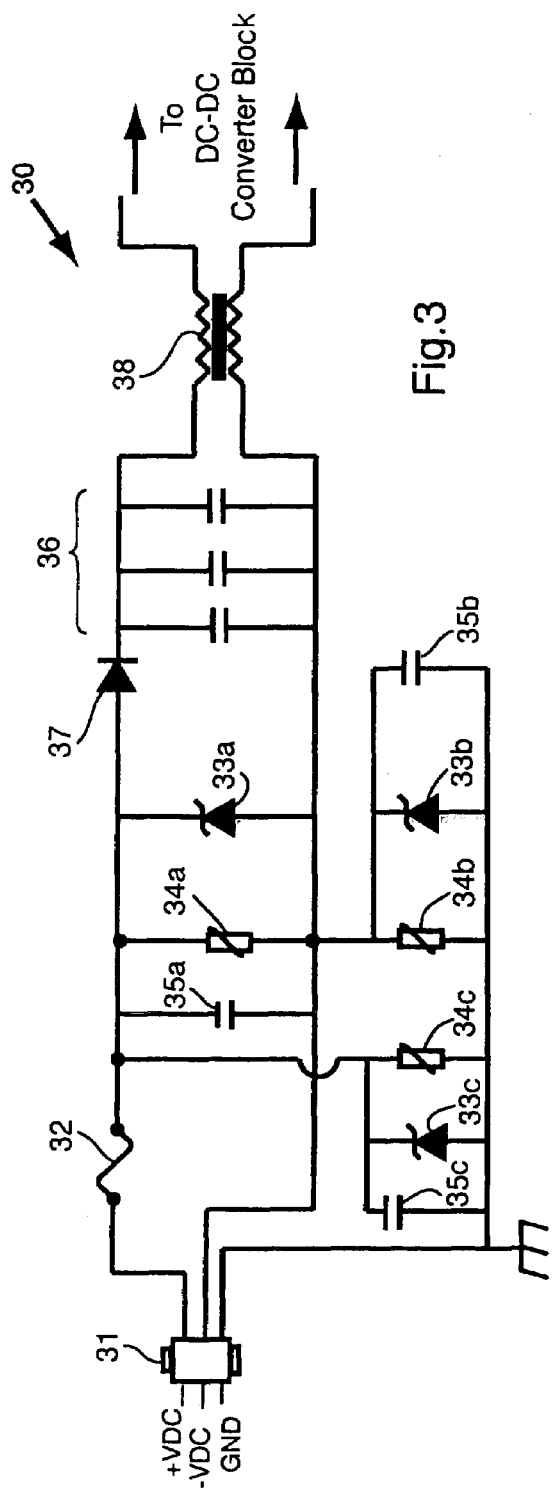
FIG. 3 shows a schematic diagram of a transient suppression circuit used in the present invention.

Referring now to FIG. 3. a detailed schematic diagram of the transient suppression circuit 26a, 26d used in the present embodiment of the invention is shown generally by reference numeral 30. Voltage transients entering via the external power connector 31 having a positive power line +VDc, a negative power line −VDc and an earth ground line GND are filtered back to their source by capacitors 35a, 35b and 35c which provide a high frequency bypass for both differential and common mode noise transients. To ensure that transients with high voltage levels do not exceed the ratings of components such as the bypass capacitors 35a, 35b and 35c, Transzorbs 33a, 33b and 33c and Metal Oxide Varistors (MOVs) 34a, 34b and 34c are used to clamp both differential and common mode high-voltage transients to acceptable levels. These components must be rated with high instantaneous peak-power dissipation capacity. This capacity may be provided by ST Microelectronic's TRANSIL components or General Semiconductor Industries Inc. TransZorb (Trade Mark) for a un-directional Zenerdiode or no-directional solid state transient voltage suppressor components which are capable of dissipating 400 W to 1.5 KW for a period of 1 ms. Suitable MOV components may be selected from Harris Corporation's ZA series.

It should be appreciated that the present embodiment of the invention allows for either Transzorbs 33 or MOVs 34 as a voltage clamping device depending on what type of failure mode is desired for these components. Tanszorbs will 33 "fail short" when parameters are exceeded while MOVs 34 will "fail open" (i.e. open circuit) when parameters are exceeded. Failing open allows the system to continue functioning but now leaves the remaining circuitry in its path unprotected. Failing short will halt the remainder of the system and typically cause the short circuit fuse 32 to blow thereby isolating the system 30 from any further damaging transients. The blocking rectifier diode 37 is used to prevent the application of a reverse polarity voltage source at the input power connector 1. Capacitor bank 36 provides further differential mode filtering while common mode choke 38 provides further common mode filtering of any remnants of noise or harmful electrical transients which have made it passed the initial bypass capacitors 36 and the Transzorb 33 or MOV 34 clamping devices. Suitable values for the capacitor bank 36 capacitors are 680 nF/100V ceramic capacitors manufactured by KEMET. Suitable values for the common mode choke are 1.2 mH per leg as manufactured by EPCOS. Preferably, the transient suppression circuit 30 shown in FIG. 3 is sufficient to pass the electrical transients type tests as defined by the following standards:
1. Surge Withstand Capability as per ANSI/IEEE C37.90.1 (1989) standards.
2. Surge Immunity as per IEC 61000-4-5 (1995 Level 4) standards.
3. High Frequency Noise Disturbance as per IEC 60255-22-1 (1988 Class III) standards.
4. Fast Transient Disturbance as per IEC 60255-224 (1992 Class IV) standards. 5. High Voltage Impulse Test as per IEC 60255-5: 1977 standard.

Referring back to FIG. 2, the outputs of power supply block #1 26b and power supply block #2 26c are electrically OR-ed via the OR-ing diodes block 26e. The system 20 has been designed such that should power supply block #1 fail then all of the required current to drive the system will be provided by power supply block #2 and vice-versa. At the core of each of the power supply blocks is a high efficiency DC-DC converter such as that provided by Artesyn's EXB30 which has an operating efficiency of 92% and an operating temperature of −40 to 85° C. The high efficiency ensures heat dissipation within the system's enclosure is minimal. It should be appreciated that the use of dual redundant power supply blocks in the system 20 improves the system reliability and availability.

Cooling for components requiring cooling to maintain their case temperatures below the manufacturer's recommended operating limit is accomplished via the thermoelectric cooling block 27. The cooling block 27 comprises a thermoelectric cooler (TEC) 27a, which is controlled by an electronic control block 27b, and a temperature sensor 27c is mounted on the components requiring cooling. The control block 27b performs the function of measuring the ambient temperature inside the enclosure of the operating unit via the temperature sensor 27c, comparing it to predefined limit such as 70° C. and upon the ambient temperature reaching the limit the control block 27b applies power to the TEC. A control block of this type can be implemented via a National Semiconductor LM26 Factory Preset Thermostat designed to be mounted on printed circuit boards for use in microprocessor thermal management systems. The LM26 integrates the temperature sensor 27c and the measurement and control block 27b in a package capable of operating over a temperature range of −55 to 110° C.

Beyond this predetermined range, or other ranges, the control block 27b applies a current to the TEC 27a.

Figure 4:
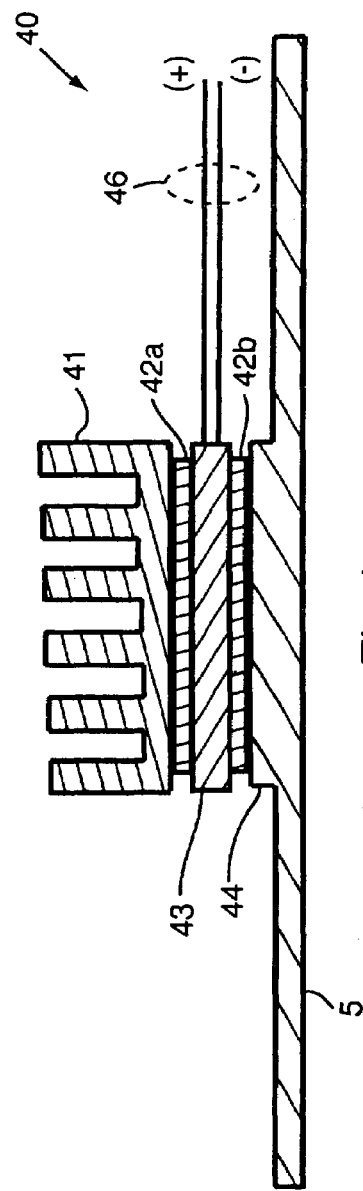
FIG. 4 shows a diagram detailing the application of a Thermoelectric Cooler (TEC) device to an electronic component such as a microprocessor.

FIG. 4 shows a diagram of the application of TEC 43 to an electronic component such as a microprocessor on a printed circuit board 45. The TEC itself 43 is mounted in between the component 44 and the heat sink 1 via layers of thermal epoxy 42a, 42b. A DC current to power to the TEC 43 is delivered via wired leads 46 and controlled via the TEC control block 27b of FIG. 2. A plurality of TECs 43 may be applied in the present embodiment of the invention to components requiring cooling. It should be appreciated that by eliminating the need for cooling fans and thus rotating mechanical parts typically found in cooling fans, the reliability and thus the applicability of the system has been improved.

Figure 5:
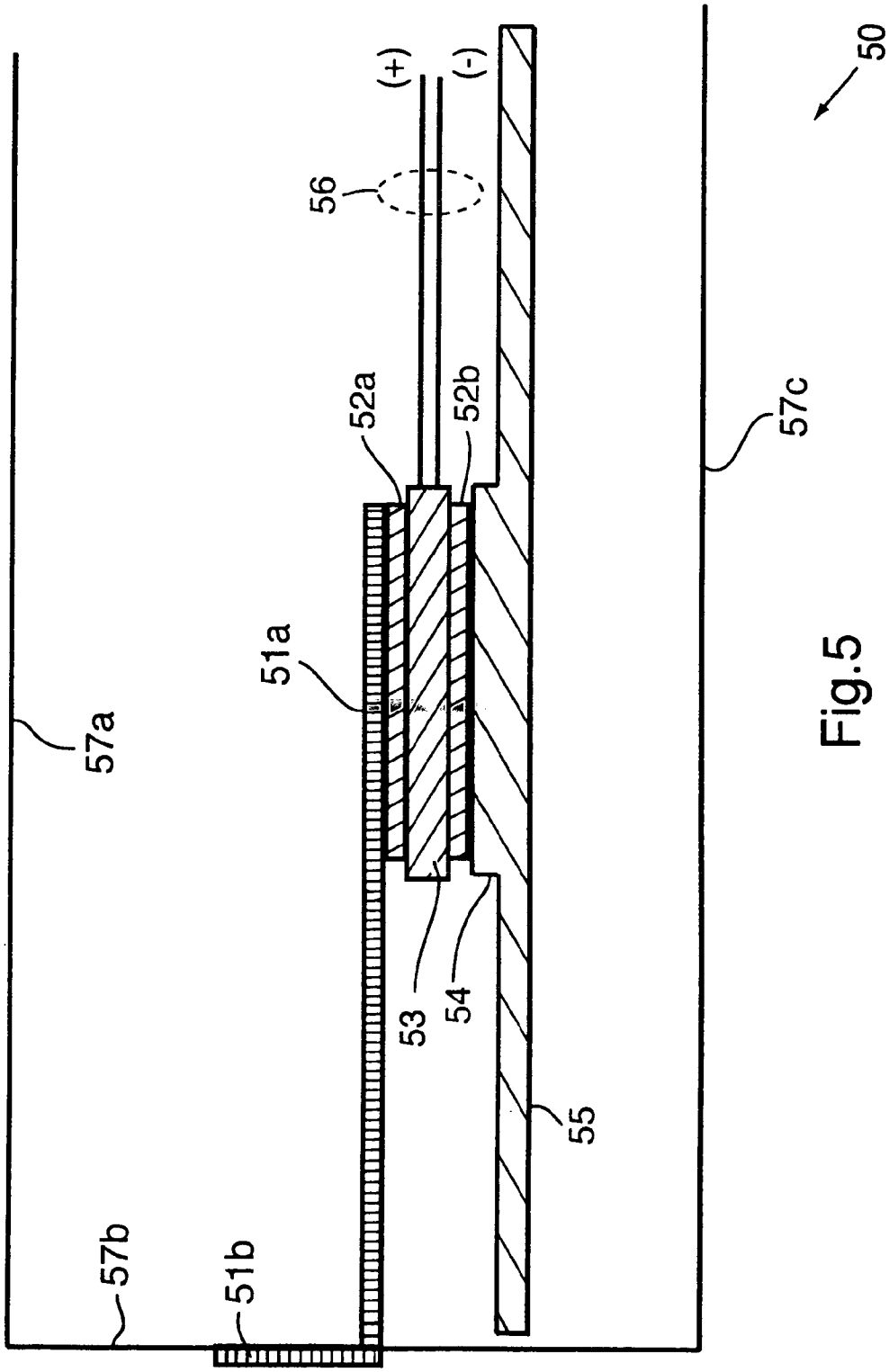
FIG. 5 shows a diagram detailing the application of Thermoelectric Cooler (TEC) device to an electronic component using an extended heat sink with an external surface.

FIG. 5 illustrates use of a TEC 53, according to a further embodiment, to an electronic component using an extended heat sink 51a with an external surface 51b. In some embodiments of the invention the heat sink 51a is mounted on the TEC 53 via thermal compound 52a and the external surface 51b extends outside of the metallic enclosure 57b. It should be appreciated that this heat sink arrangement allows heat to be conducted outside of the enclosure 57c and dissipated via convection to the outside ambient environment.

Utilizing the present invention will permit data packets to be transmitted reliably even in harsh. In other words, the environmentally hardened switch according to the present invention provides for zero packet loss even in environments in which other Ethernet switches would not function. This permits the Ethernet switch of the present invention to function for substantial periods of time without losing any data, which increases the efficiency and robustness of the entire system.

It will be understood that, although various features of the invention have been described with respect to one or another of the embodiments of the invention, the various features and embodiments of the invention may be combined or used in conjunction with other features and embodiments of the invention as described and illustrated herein.

Although this disclosure has described and illustrated certain preferred embodiments of the invention, it is to be understood that the invention is not restricted to these particular embodiments. Rather, the invention includes all embodiments, which are functional, electrical or mechanical equivalents of the specific embodiments and features that have been described and illustrated herein.

The invention claimed is:

1. In an Intelligent Electronic Device (IED) for operation in an electrical power utility substation, a power supply circuit to supply power to internal components of the IED, said power supply circuit comprising:

a first power block for converting received power from an external power source to a voltage to be used by the internal components of the IED, said first power block comprising;

an external power connector having a positive power line, a negative power line and an earth ground, said external power connector receiving power from the external power source;

at least three uni-directional solid state transient voltage suppressors each of which is connected in parallel with a corresponding one of at least three metal oxide varistors and a corresponding one of at least three capacitors, said uni-directional transient voltage suppressors and varistors clamping both differential and common mode high voltage transients to acceptable levels for the internal components by clamping the positive power line to the earth ground, by clamping the negative power line to the earth ground and by clamping the positive power line to the negative power line;

wherein the uni-directional transient voltage suppressor will "fail short" when operating parameters arc exceeded which will halt the remainder of the system by causing a fuse to blow thereby isolating the internal components from any other further damaging transients, and wherein the varistors will "fail open" allowing the system to continue functioning, but leaving the remaining circuitry in the path unprotected;

a second power block for converting received power from an external power source to a voltage to be used by the internal components of the IED;

a first transient suppression circuit associated with the second power block for suppressing electrical transients in power received from the second power block;

a second transient suppression circuit associated with the first power block for suppressing electrical transients in power received from the first power block;

an electrical OR-ing diode block for outputting power received from the external power source by either the first power block or the second power block to the internal components of the IED; and wherein power received from either the first power block or the second power block is sufficient to drive the IED.

2. The power supply circuit as defined in claim 1 wherein the first power block comprises a high efficiency DC to DC converter; and wherein the second power block comprises a second high efficiency DC to DC converter.

3. The power supply circuit as defined in claim 2 wherein the first high efficiency DC to DC converter and the second high efficiency DC to DC converter both have an operating efficiency of 92% and an operating temperature of −40° to 85° C.

4. The power supply as defined in claim 1 wherein the first transient circuit further comprises a blocking rectifier diode used to prevent the application of a reverse polarity voltage source at the power input connector.

5. The power supply as defined in claim 4 wherein the first transient circuit further comprises a capacitor bank connected in parallel with one of the at least three capacitors between the positive power line and the negative power line to provide further differential mode filtering.

6. The power supply as defined in claim 5 wherein the first transient circuit further comprises a common mode choke connected to the capacitor bank and providing further common mode filtering of any remnants of noise or harmful electrical transients which may have passed the at least three bypass capacitors, the capacitors bank, the at least three uni-directional transient voltage suppressors, or the metal oxide varistors.

7. The power supply as defined in claim 6 wherein the second transient circuit and the first transient circuit have the same structure.

* * * * *